United States Patent
Toyomura et al.

(10) Patent No.: US 10,121,692 B2
(45) Date of Patent: Nov. 6, 2018

(54) SUBSTRATE HOLDING APPARATUS

(71) Applicant: Ebara Corporation, Tokyo (JP)

(72) Inventors: Naoki Toyomura, Tokyo (JP); Mitsuru Miyazaki, Tokyo (JP); Takuya Inoue, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/935,893

(22) Filed: Nov. 9, 2015

(65) Prior Publication Data

US 2016/0141201 A1 May 19, 2016

(30) Foreign Application Priority Data

Nov. 14, 2014 (JP) ................. 2014-231817

(51) Int. Cl.
*H01L 21/687* (2006.01)
*B25B 5/00* (2006.01)
*B25B 5/14* (2006.01)

(52) U.S. Cl.
CPC .............. *H01L 21/68728* (2013.01)

(58) Field of Classification Search
CPC .............................. H01L 21/68728
See application file for complete search history.

(56) References Cited

U.S. PATENT DOCUMENTS

| | | | | |
|---|---|---|---|---|
| 3,556,504 | A * | 1/1971 | Sinclair | F16F 3/04 267/168 |
| 6,827,092 | B1 * | 12/2004 | Smith | H01L 21/68728 134/147 |
| 8,795,032 | B2 | 8/2014 | Miyazaki et al. | |
| 2009/0305612 | A1 * | 12/2009 | Miyazaki | B24B 37/345 451/11 |
| 2011/0073781 | A1 | 3/2011 | Leavitt et al. | |
| 2012/0318304 | A1 * | 12/2012 | Wang | B08B 3/024 134/33 |
| 2013/0320636 | A1 * | 12/2013 | Ogawa | H01L 21/68728 279/110 |
| 2014/0197610 | A1 | 7/2014 | Miyazaki et al. | |
| 2014/0373289 | A1 * | 12/2014 | Miyazaki | H01L 21/67051 15/21.1 |

FOREIGN PATENT DOCUMENTS

| | | | | |
|---|---|---|---|---|
| JP | 2009-295751 | A | 12/2009 | |
| JP | 2010/050436 | A | 3/2010 | |
| JP | 2013229409 | A * | 11/2013 | ....... H01L 21/68728 |

* cited by examiner

*Primary Examiner* — Marc Carlson
(74) *Attorney, Agent, or Firm* — Leydig, Voit & Mayer, Ltd.

(57) ABSTRACT

There is disclosed an improved substrate holding apparatus which can minimize deformation of a spring, which is provided to bias a support post for supporting a substrate, even when a large centrifugal force acts on the spring. The substrate holding apparatus includes: a support post movable in an axial direction thereof; a chuck provided on the support post and configured to hold a periphery of a substrate; a spring biasing the support post in the axial direction; a first structure configured to restrict a movement of an upper portion of the spring in a direction perpendicular to the axial direction of the support post; and a second structure configured to restrict a movement of a lower portion of the spring in a direction perpendicular to the axial direction of the support post.

24 Claims, 14 Drawing Sheets

SUBSTRATE HOLDING APPARATUS

CROSS REFERENCE TO RELATED APPLICATION

This document claims priority to Japanese Patent Application Number 2014-231817 filed Nov. 14, 2014, the entire contents of which are hereby incorporated by reference.

BACKGROUND

A substrate holding apparatus is known as a device for holding a periphery of a substrate, such as a wafer, and rotating the substrate. Such a substrate holding apparatus is used in a processing apparatus, such as a drying apparatus for drying a substrate by spraying an IPA vapor onto a surface of a substrate while rotating the substrate.

The above-described substrate holding apparatus includes a plurality of support posts for supporting a periphery of a substrate. These support posts are arranged along the periphery of the substrate. A spring is disposed around each of the support posts so that the support posts are biased downwardly by the springs. The support posts are elevated by a lifter. When the substrate is transferred from a transfer robot to the substrate holding apparatus, the support posts are elevated by the lifter against the forces of the springs. When the substrate is to be processed while the substrate holding apparatus is to rotate the substrate, the lifter moves down and the support posts are forced downwardly by the springs.

During processing of the substrate, the substrate is rotated around its axis. There has recently been a demand to rotate a substrate as fast as possible in order to increase a throughput of the processing of the substrate. However, when the substrate is rotating at a high speed, strong centrifugal forces act on the springs disposed around the support ports, thus causing the springs to deform outwardly. Such deformation of the springs generates large stresses in the springs, which can fatigue the springs. As a result, the springs may be broken before expiration of an expected lifetime of the springs.

Further, when the substrate is rotating at a high speed, strong centrifugal forces act also on the support posts, thereby causing outward displacement of respective ends of the support posts. As a result, the substrate, supported by the support posts, can become unstable.

SUMMARY OF THE INVENTION

According to an embodiment, there is provided an improved substrate holding apparatus which can minimize deformation of a spring, which is provided to bias a support post for supporting a substrate, even when a large centrifugal force acts on the spring.

According to an embodiment, there is further provided a substrate holding apparatus which can prevent an outward displacement of a support post for supporting a substrate.

Embodiments, which will be described below, relate to a substrate holding apparatus for holding a substrate, such as a wafer.

In an embodiment, there is provided a substrate holding apparatus comprising: a support post movable in an axial direction thereof; a chuck provided on the support post and configured to hold a periphery of a substrate; a spring biasing the support post in the axial direction; a first structure configured to restrict a movement of an upper portion of the spring in a direction perpendicular to the axial direction of the support post; and a second structure configured to restrict a movement of a lower portion of the spring in a direction perpendicular to the axial direction of the support post.

In an embodiment, the first structure has an inner circumferential surface that surrounds the upper portion of the spring, and the second structure is disposed inside the spring and has an outer circumferential surface that supports the lower portion of the spring.

In an embodiment, the first structure is disposed inside the spring and has an outer circumferential surface that supports the upper portion of the spring, and the second structure has an inner circumferential surface that surrounds the lower portion of the spring.

In an embodiment, the support post is rotatable relative to the second structure.

In an embodiment, the substrate holding apparatus further comprises: a moving mechanism configured to move the support post in the axial direction against a force of the spring; and a rotating mechanism configured to rotate the support post about its axis in conjunction with a movement of the support post in the axial direction.

In an embodiment, the support post is one of a plurality of support posts, the chuck is one of a plurality of chucks, the spring is one of a plurality of springs, the first structure is one of a plurality of first structures, and the second structure is one of a plurality of second structures, and the substrate holding apparatus further comprises a coupling ring which couples the plurality of support posts to each other.

In an embodiment, the plurality of support posts and the plurality of chucks are arranged along the periphery of the substrate.

In an embodiment, there is provided a substrate holding apparatus comprising: a plurality of support posts each movable in an axial direction thereof; a plurality of chucks provided on the plurality of support posts, respectively, and configured to hold a periphery of a substrate; and a coupling ring which couples the plurality of support posts to each other, the coupling ring being rotatable together with the plurality of support posts.

According to the above-described embodiments, an outward movement (or displacement) of the spring is restricted by the first structure and the second structure. This can avoid a generation of an excessive stress in the spring even when a strong centrifugal force acts on the spring. As a result, an unexpected breakage of the spring can be prevented.

Further, according to the above-described embodiment, the coupling ring restricts a relative position of the support posts, thereby preventing an outward displacement of the support posts even when strong centrifugal forces act on the support posts.

DESCRIPTION OF EMBODIMENTS

Figure 1:
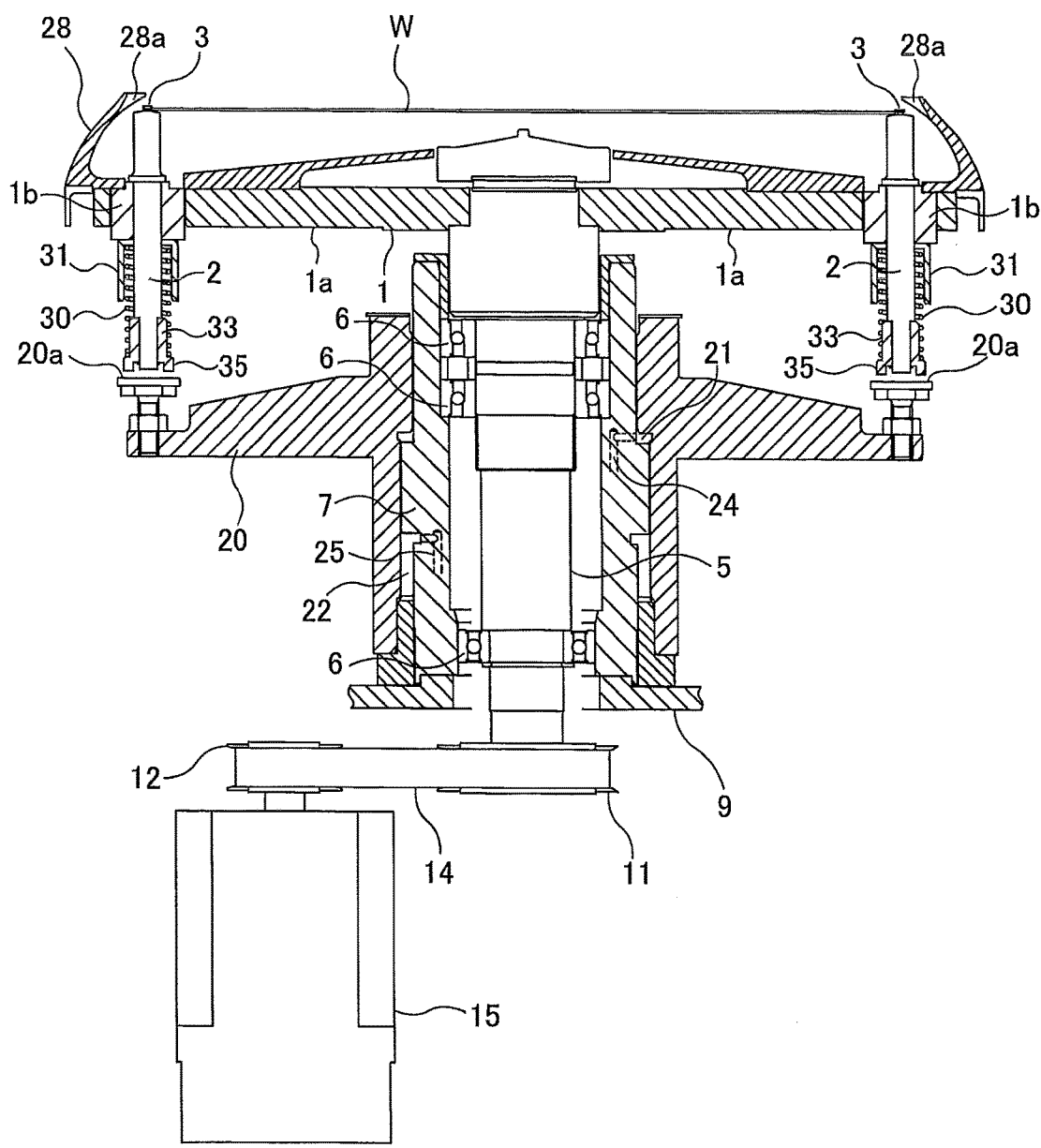
FIG. 1 is a vertical cross-sectional view of a substrate holding apparatus according to an embodiment.
Figure 2:
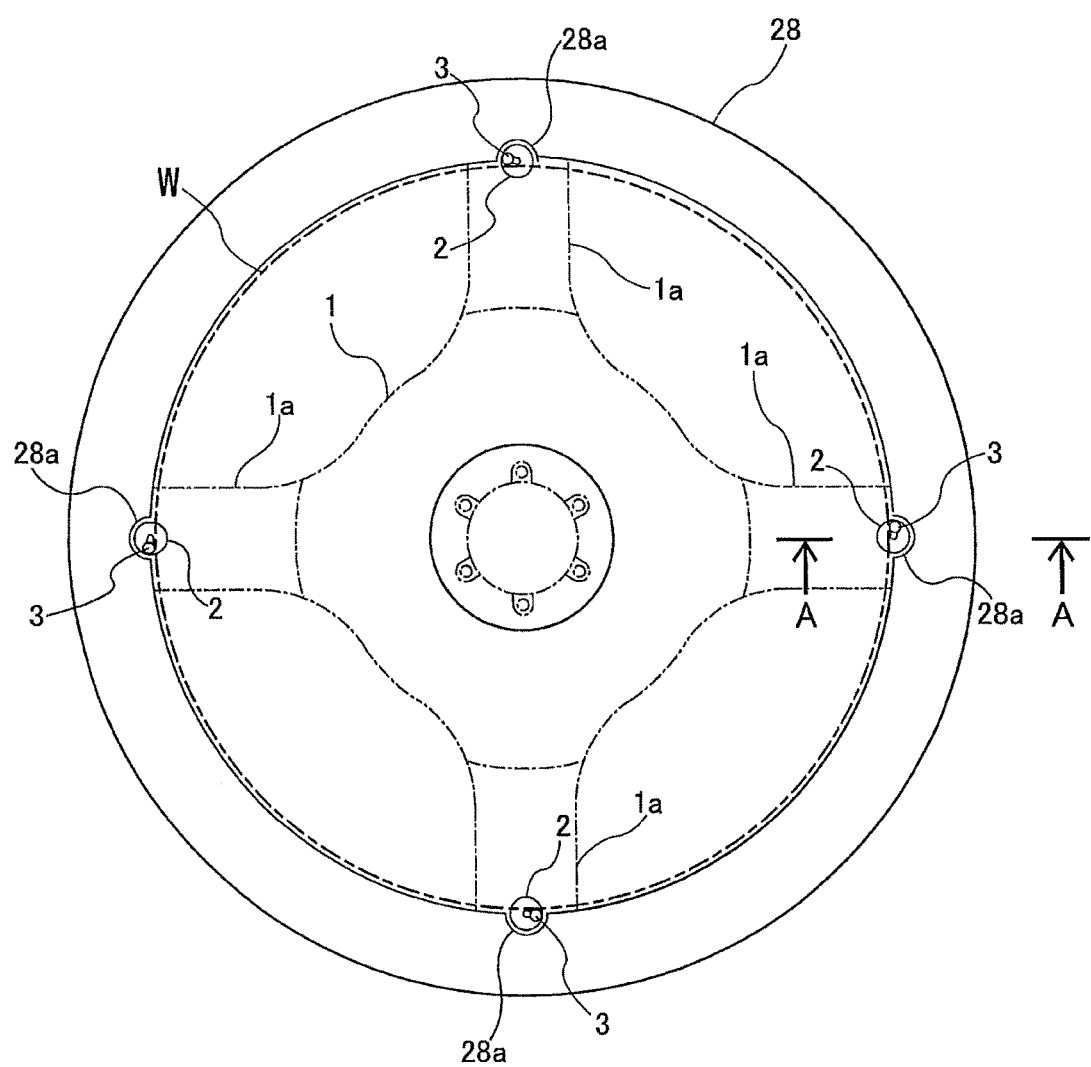
FIG. 2 is a plan view of the substrate holding apparatus shown in FIG. 1.

Embodiments will now be described in detail with reference to the drawings. FIG. 1 is a vertical cross-sectional view of a substrate holding apparatus according to an embodiment. FIG. 2 is a plan view of the substrate holding apparatus shown in FIG. 1.

As shown in FIG. 1 and FIG. 2, the substrate holding apparatus includes a base 1 having four arms 1a, four support posts 2 supported by distal ends of the arms 1a, respectively, and four chucks 3 provided on upper ends of the support posts 2, respectively. Each of the support posts 2 is movable upwardly and downwardly relative to the base 1, and is rotatable about its own axis. The support posts 2 are provided with the chucks 3 for holding a periphery of a wafer W which is an example of a substrate. The support posts 2 and the chucks 3 are arranged at equal intervals along the periphery of the wafer W.

The base 1 is secured to an upper end of a rotational shaft 5, which is rotatably supported by bearings 6. The bearings 6 are fixed to an inner circumferential surface of a cylindrical member 7 that surrounds the rotational shaft 5. A lower end of the cylindrical member 7 is mounted to a pedestal 9 and is fixed in its position. The rotational shaft 5 is coupled to a motor 15 through pulleys 11, 12 and a belt 14 so that the base 1 is rotated about its axis when the motor 15 is set in motion. The wafer W is held by the chucks 3 and rotated about its central axis of the wafer W by the motor 15.

Figure 3:
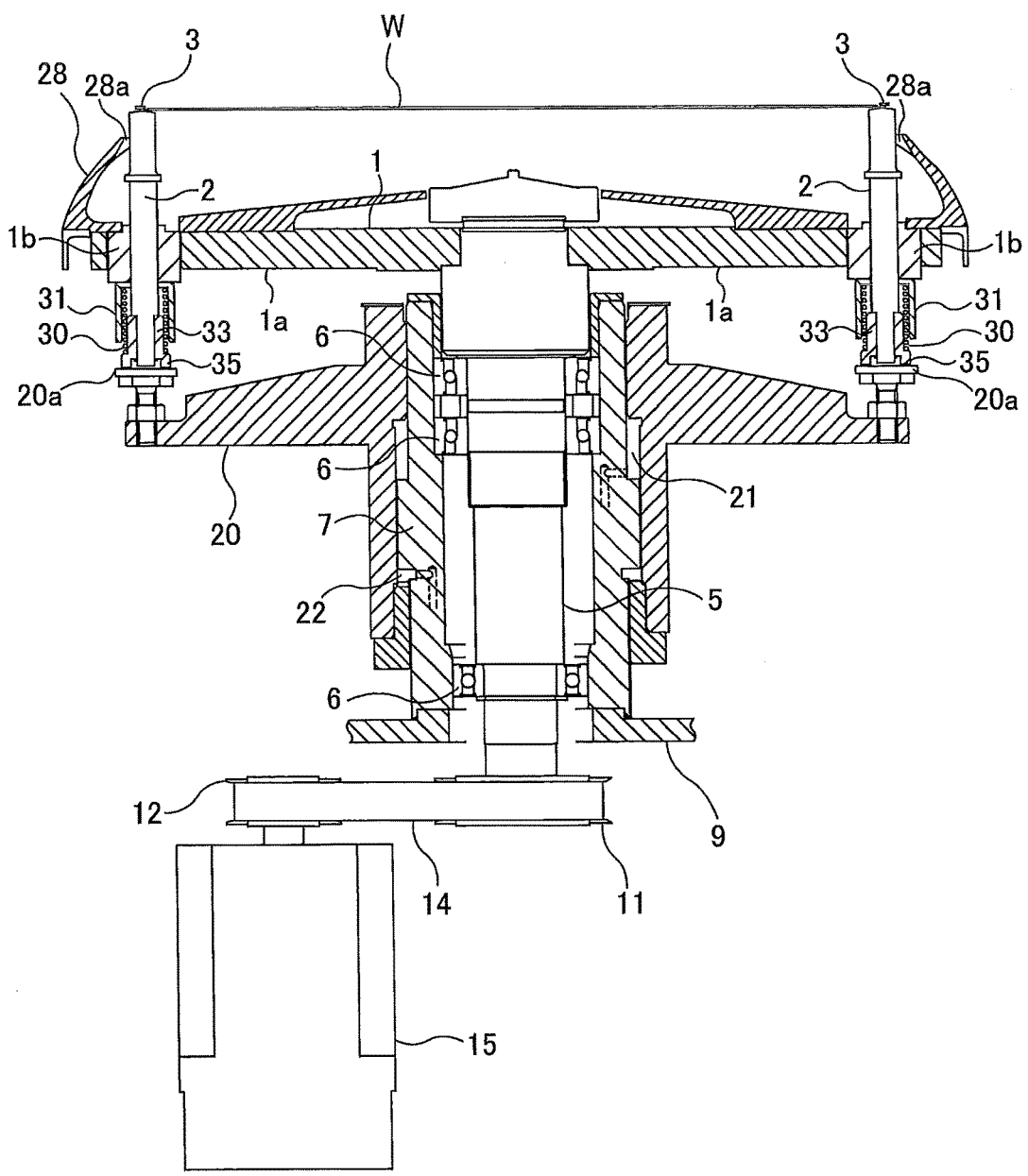
FIG. 3 is a diagram showing the substrate holding apparatus with its support posts elevated by a lifter.

A lifter 20 for elevating the support posts 2 is provided around the cylindrical member 7. This lifter 20 is configured to be able to slide vertically relative to the cylindrical member 7. The lifter 20 has four pushers 20a that elevate the support posts 2, respectively. A first gas chamber 21 and a second gas chamber 22 are formed between an outer circumferential surface of the cylindrical member 7 and an inner circumferential surface of the lifter 20. The first gas chamber 21 and the second gas chamber 22 communicate with a first gas flow passage 24 and a second gas flow passage 25, respectively. The first gas flow passage 24 and the second gas flow passage 25 are coupled to a not-shown pressurized gas supply source. When pressure in the first gas chamber 21 is increased higher than pressure in the second gas chamber 22, the lifter 20 is moved upward as shown in FIG. 3. Conversely, when the pressure in the second gas chamber 22 is increased higher than the pressure in the first gas chamber 21, the lifter 20 is moved downward as shown in FIG. 1. The lifter 20 can cause the four support posts 2 and the four chucks 3 to move up and down simultaneously.

A rotary cup 28 is secured to an upper surface of the base 1. This rotary cup 28 is provided for receiving a liquid, which has been scattered around by a centrifugal force, from the rotating wafer W. FIG. 1 and FIG. 3 show a vertical cross-sectional view of the rotary cup 28. The rotary cup 28 is arranged so as to surround an entire circumference of the wafer W. The rotary cup 28 has a vertical cross-sectional shape that is inclined radially inwardly. Further, the rotary cup 28 has an inner circumferential surface that is formed by a smooth curved surface. An upper edge of the rotary cup 28 lies close to the wafer W, and an inner diameter of the upper edge of the rotary cup 28 is slightly larger than a diameter of the wafer W. Cutout portions 28a, each having a shape conforming to a shape of a peripheral surface of each support post 2, are formed in the upper edge of the rotary cup 28 at positions corresponding to positions of the support posts 2. Obliquely extending drain holes (not shown) are formed in a bottom of the rotary cup 28.

Figure 4A:
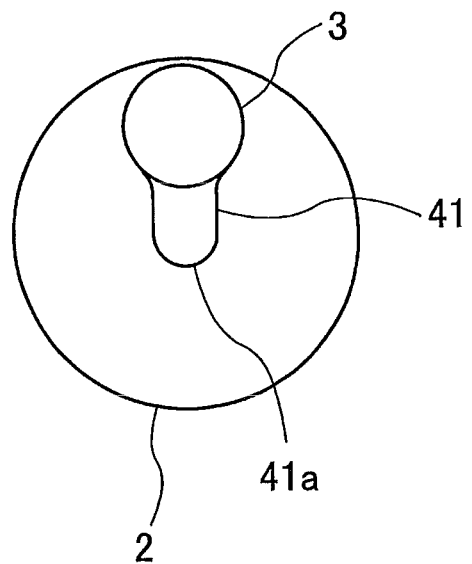
FIG. 4A is a plan view showing a chuck.
Figure 4B:
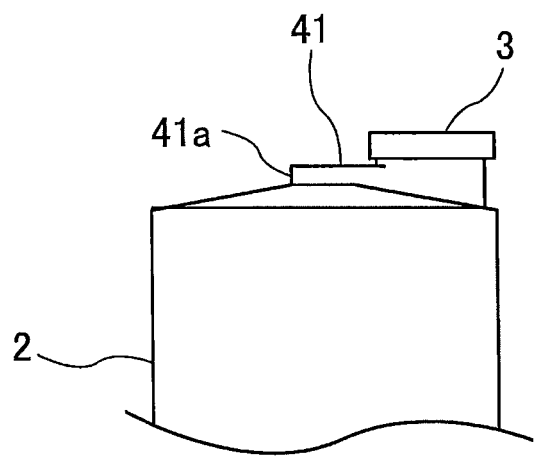
FIG. 4B is a side view showing the chuck.

FIG. 4A is a plan view showing the chuck 3, and FIG. 4B is a side view of the chuck 3. The chuck 3 is formed at an eccentric position on the upper end of the support post 2. This chuck 3 is configured to come into contact with the periphery of the wafer W to thereby hold the periphery of the wafer W. A positioning portion 41, extending from the chuck 3 to the central axis of the support post 2, is formed on the upper end of the support post 2. One end of the positioning portion 41 is connected integrally to a side surface of the chuck 3, and the other end is located on the central axis of the support post 2. This center-side end of the positioning portion 41 has a side surface 41a that is curved along a circle which is concentric with the support post 2. The upper end of the support post 2 has a tapered surface inclined downwardly.

Figure 5A:
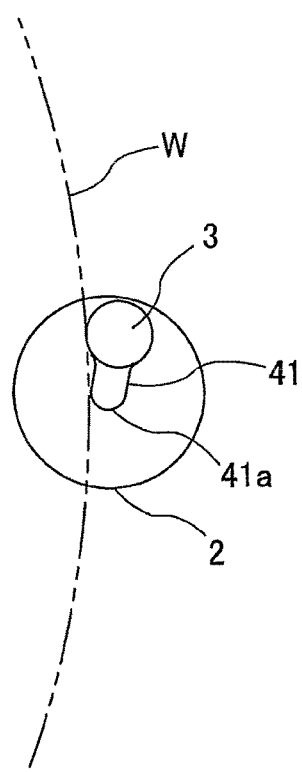
FIG. 5A is a plan view showing the chuck when holding a wafer.
Figure 5B:
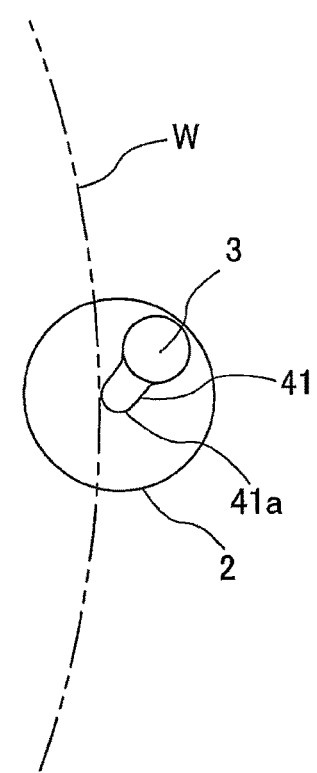
FIG. 5B is a plan view showing the chuck which has released the wafer.

FIG. 5A is a plan view of the chuck 3 when holding the wafer W, and FIG. 5B is a plan view of the chuck 3 which has released the wafer W. The wafer W is placed on the upper end (the tapered surface) of each support post 2. When the support post 2 is rotated in one direction, the chuck 3 is brought into contact with the periphery of the wafer W to thereby hold the wafer W, as shown in FIG. 5A. When the support post 2 is rotated in the opposite direction, the chuck 3 is separated from the wafer W to thereby release the wafer W, as shown in FIG. 5B. At this time, the periphery of the wafer W is placed in contact with the side surface 41a of the center-side end of the positioning portion 41. This side surface 41a of the positioning portion 41 can restrict a displacement of the wafer W which can occur when the support post 2 rotates. As a result, subsequent wafer transferring operations can be performed stably.

Figure 6:
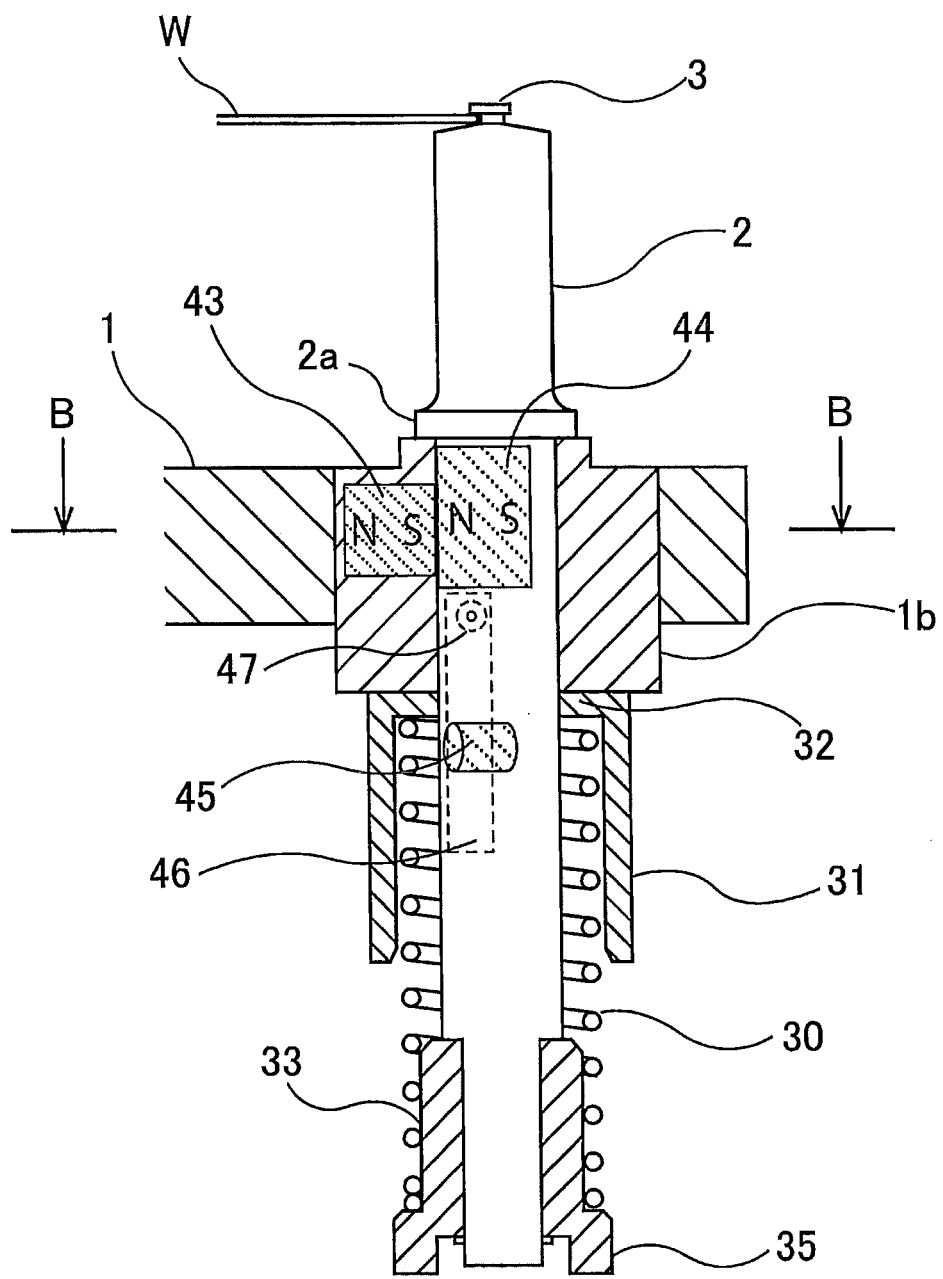
FIG. 6 is a cross-sectional view taken along line A-A of FIG. 2.
Figure 7:
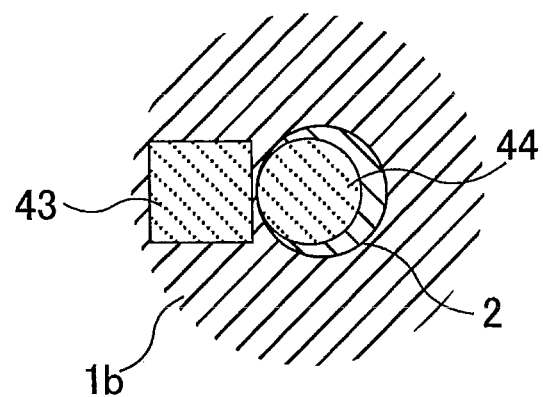
FIG. 7 is a cross-sectional view taken along line B-B of FIG. 6.

FIG. 6 is a cross-sectional view taken along line A-A of FIG. 2, and FIG. 7 is a cross-sectional view taken along line B-B of FIG. 6. The depiction of the rotary cup 28 is omitted from FIGS. 6 and 7. Each of the arms 1a of the base 1 has a holding member 1b for slidably holding the support post 2. This holding member 1b may be formed integrally with the arm 1a. The holding member 1b has a vertically-extending through-hole in which the support post 2 is inserted. A diameter of the through-hole is slightly larger than a diameter of the support post 2, so that the support post 2 can move vertically relative to the base 1 and can rotate about its axis.

The substrate holding apparatus has springs 30 for biasing the support posts 2 in their axial directions. Outer covers 31 are mounted respectively to lower surfaces of the holding members 1b of the base 1. Each outer cover 31 has an inner circumferential surface that surrounds an upper portion of each spring 30. In this embodiment, the outer cover 31 is disposed so as to surround an upper half of the spring 30. The upper end of the spring 30 is in contact with an inner flange 32 formed at the upper end of the outer cover 31. The inner flange 32 may be omitted. In that case, the upper end of the spring 30 is in contact with the lower surface of the holding member 1b of the base 1. A diameter of the inner circumferential surface of the outer cover 31 may be equal to or slightly larger than an outer diameter of the spring 30. In this embodiment, the diameter of the inner circumferential surface of the outer cover 31 is slightly larger than the outer diameter of the spring 30.

Inner collars 33 are mounted to lower portions of the support posts 2, respectively. Each of the inner collars 33 is a member having a cylindrical shape. Each spring 30 is disposed so as to surround each support post 2 and each inner collar 33. The inner collar 33 is disposed inside the spring 30 and has an outer circumferential surface that supports a lower portion of the spring 30. A diameter of the outer circumferential surface of the inner collar 33 may be equal to or slightly smaller than an inner diameter of the spring 30. In this embodiment, the diameter of the outer circumferential surface of the inner collar 33 is equal to the inner diameter of the spring 30, so that the outer circumferential surface of the inner collar 33 is in contact with the lower portion of the spring 30. Further, the diameter of the outer circumferential surface of the inner collar 33 is larger than the diameter of the peripheral surface of the support post 2. The outer cover 31 and the inner collar 33 are made of a resin having high abrasion resistance. For example, the outer cover 31 and the inner collar 33 are made of PTFE (polytetrafluoroethylene).

Spring stoppers 35 are connected to lower ends of the inner collars 33, respectively. In this embodiment the spring stoppers 35 are formed integrally with the inner collars 33. In one embodiment, the inner collars 33 and the spring stoppers 35 may be different members. The support post 2 is coupled to the inner collar 33 and can rotate about the axis of the support post 2. More specifically, the support post 2 is rotatable relative to the inner collar 33 and the spring stopper 35.

The upper end of the spring 30 presses the holding member 1b of the base 1, while the lower end of the spring 30 presses the spring stopper 35 coupled to the support post 2. Therefore, the spring 30 in this embodiment biases the support post 2 downwardly. A support post stopper 2a, having a diameter larger than the diameter of the throughhole of the holding member 1b, is formed on the peripheral surface of the support post 2. This support post stopper 2a is located above the holding member 1b of the base 1. Therefore, as shown in FIG. 6, a downward movement of the support post 2 is restricted by the support post stopper 2a.

A first magnet 43 is embedded in the holding member 1b of the base 1. A second magnet 44 and a third magnet 45 are provided in the support post 2. The second magnet 44 and the third magnet 45 are arranged away from each other in the vertical direction. The first, second, and third magnets 43, 44, and 45 may be neodymium magnets.

Figure 8:
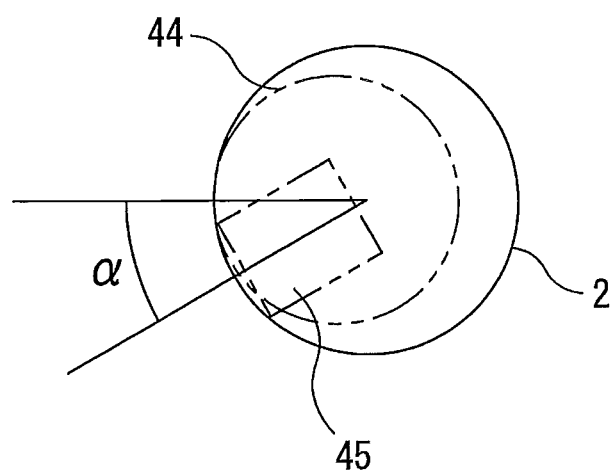
FIG. 8 is a schematic view illustrating an arrangement of a second magnet and a third magnet as viewed in an axial direction of a support post.

FIG. 8 is a schematic view showing the arrangement of the second magnet 44 and the third magnet 45, as viewed from the axial direction of the support post 2. As shown in FIG. 8, the second magnet 44 and the third magnet 45 are arranged in different positions with respect to the circumferential direction of the support post 2. Specifically, a line interconnecting the center of the second magnet 44 and the center of the support post 2 and a line interconnecting the center of the third magnet 45 and the center of the support post 2 intersect at a predetermined angle α as viewed from the axial direction of the support post 2.

When the support post 2 is in a lowered position shown in FIG. 6, the second magnet 44 is close to the first magnet 43, while the third magnet 45 is away from the first magnet 43. As a result, an attractive force acts between the first magnet 43 and the second magnet 44. This attractive force generates a force to rotate the support post 2 about its central axis in a direction such that the chuck 3 presses the periphery of the wafer W. Accordingly, the lowered position shown in FIG. 6 is a clamp position at which the wafer W is held (clamped).

Figure 9:
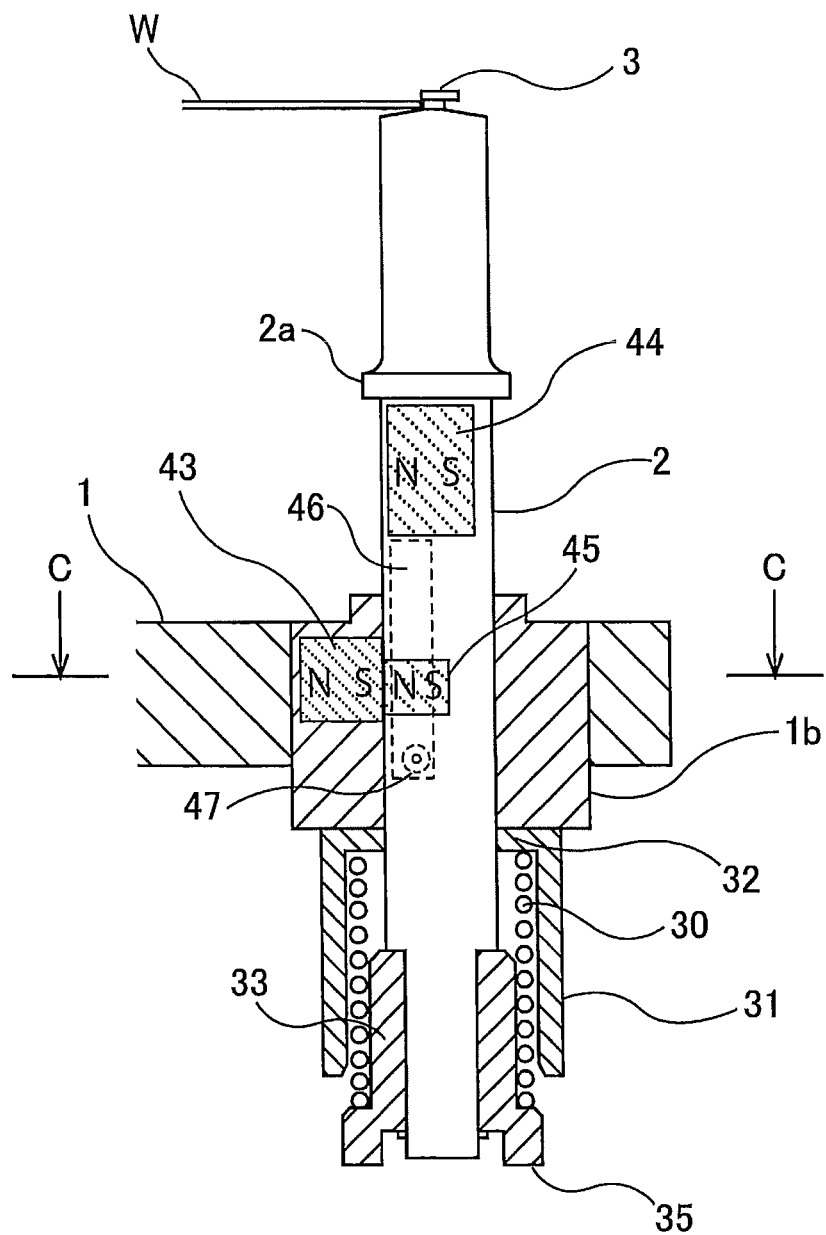
FIG. 9 is a cross-sectional view taken along the line A-A of FIG. 2, showing a support post which has been elevated by the lifter.
Figure 10:
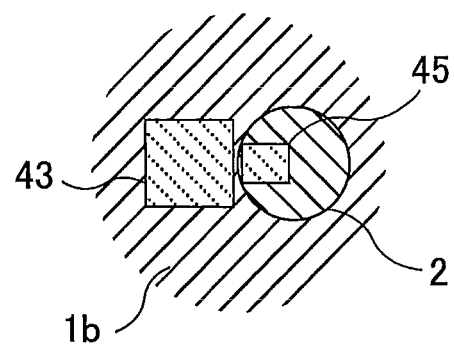
FIG. 10 is a cross-sectional view taken along line C-C of FIG. 9.

FIG. 9 is a cross-sectional view taken along the line A-A in FIG. 2 when the support post 2 is elevated by the lifter 20, and FIG. 10 is a cross-sectional view taken along line C-C in FIG. 9. When the support post 2 is elevated by the lifter 20 to an elevated position shown in FIG. 9, the third magnet 45 is close to the first magnet 43, while the second magnet 44 is away from the first magnet 43. As a result, an attractive force acts between the first magnet 43 and the third magnet 45. This attractive force generates a force to rotate the support post 2 about its central axis in a direction such that the chuck 3 moves away from the wafer W. Accordingly, the elevated position shown in FIG. 9 is an unclamp position at which the substrate is released (unclamped).

Because the second magnet 44 and the third magnet 45 are arranged in different positions with respect to the circumferential direction of the support post 2, the rotating force acts on the support post 2 as the support post 2 moves up and down. This rotating force imparts a force of holding the wafer W and a force of releasing the wafer W to the chuck 3. Therefore, by just moving the support post 2 vertically, the chuck 3 can hold and release the wafer W. In this manner, the first magnet 43, the second magnet 44, and the third magnet 45 serve as a rotating mechanism for rotating the support post 2 and the chuck 3 about the central axis of the support post 2. This rotating mechanism is actuated by the vertical movement of the support post 2.

When the support post 2 is elevated by the lifter 20, the pusher 20a of the lifter 20 comes into contact with the spring stopper 35. Since the support post 2 is rotatable independently of the spring stopper 35, the support post 2 can rotate smoothly about its axis while moving upward. On the other hand, the spring stopper 35 and the inner collar 33 do not rotate. As shown in FIG. 9, when the support post 2 is elevated against the force of the spring 30, the inner collar 33 comes to be accommodated or inserted in the outer cover 31. A cylindrical space is formed between the outer circumferential surface of the inner collar 33 and the inner circumferential surface of the outer cover 31, and the compressed spring 30 is accommodated in this cylindrical space. The lifter 20 is a moving mechanism that moves the support post 2 in its axial direction against the force of the spring 30.

A groove 46, extending along the axis of the support post 2, is formed in the side surface of the support post 2. The groove 46 has an arc-shaped horizontal cross section. The holding member 1b of the base 1 has a protruding portion 47 that protrudes toward the groove 46. A distal end of the protruding portion 47 lies in the groove 46, and the protruding portion 47 is in loose engagement with the groove 46. The groove 46 and the protruding portion 47 are provided to restrict an angle of rotation of the support post 2.

As shown in FIG. 3, when the support posts 2 are elevated, the wafer W is elevated to a position higher than the rotary cup 28 and the chucks 3 is separated away from the periphery of the wafer W. Therefore, a transporting device (not shown), such as a transfer robot, can take the wafer W from the substrate holding apparatus.

When the wafer W is at the lowered position shown in FIG. 1, the wafer W is rotated by the motor 15. When the wafer W is being rotated, a centrifugal force acts on each spring 30. Especially when the wafer W is rotated at a high speed (e.g. at a speed of 1500 to 3000 $min^{-1}$), a large centrifugal force acts on each spring 30, causing the spring 30 to deform outwardly. Such deformation fatigues the spring 30, and as a result, the spring 30 may be broken sooner than expected.

In order to prevent the outward deformation of the spring 30, the outer cover 31 is provided outside the spring 30 and the inner collar 33 is provided inside the spring 30 as shown in FIG. 6. The outer cover 31 serves as a first structure that restricts a movement (or a displacement) of the upper portion of the spring 30 in a direction perpendicular to the axial direction of the support post 2, and the inner collar 33 serves as a second structure that restricts a movement (or a displacement) of the lower portion of the spring 30 in a direction perpendicular to the axial direction of the support post 2.

When the wafer W is rotating, the upper portion of the spring 30 is supported from outside by the outer cover 31, and the lower portion of the spring 30 is supported from inside by the inner collar 33. Accordingly, even when a strong centrifugal force acts on the spring 30, the outward deformation of the spring 30, i.e., the movement of the spring 30 in a direction perpendicular to the axial direction of the support post 2, is restricted or limited by the outer cover 31 and the inner collar 33. Therefore, the spring 30 hardly deforms, and no large stress is generated in the spring 30. As a result, unexpected breakage of the spring 30 can be prevented. As shown in FIGS. 3 and 9, when the support post 2 is elevated in order to release the wafer W from the chuck 3, the inner collar 33 is moved until it is accommodated (or inserted) in the outer cover 31. The inner collar 33 and the outer cover 31 thus do not interfere with the upward movement of the support post 2 and can make the mechanism compact.

Figure 11:
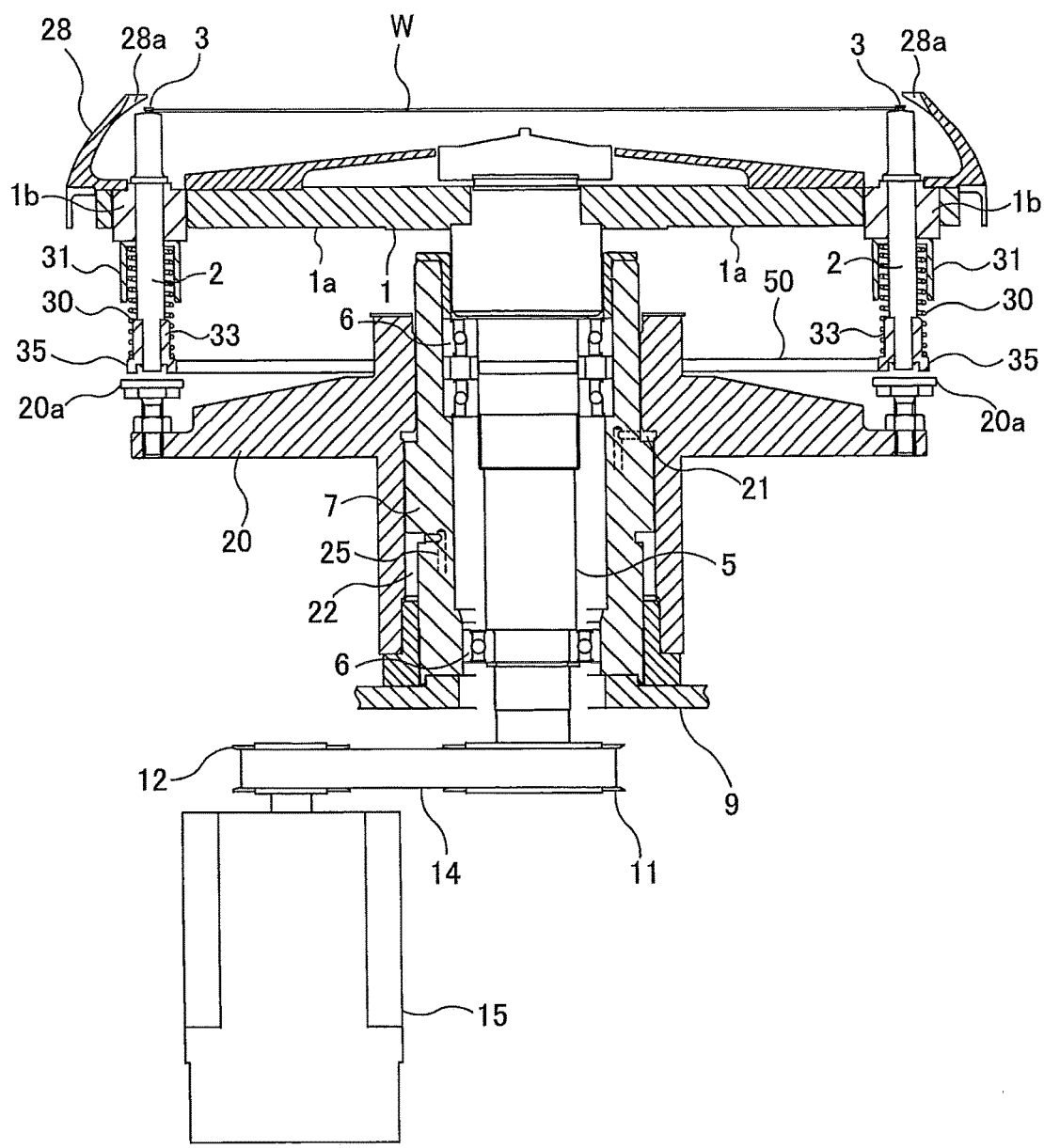
FIG. 11 is a cross-sectional view of the substrate holding apparatus having a coupling ring coupling lower ends of four support posts together.
Figure 12:
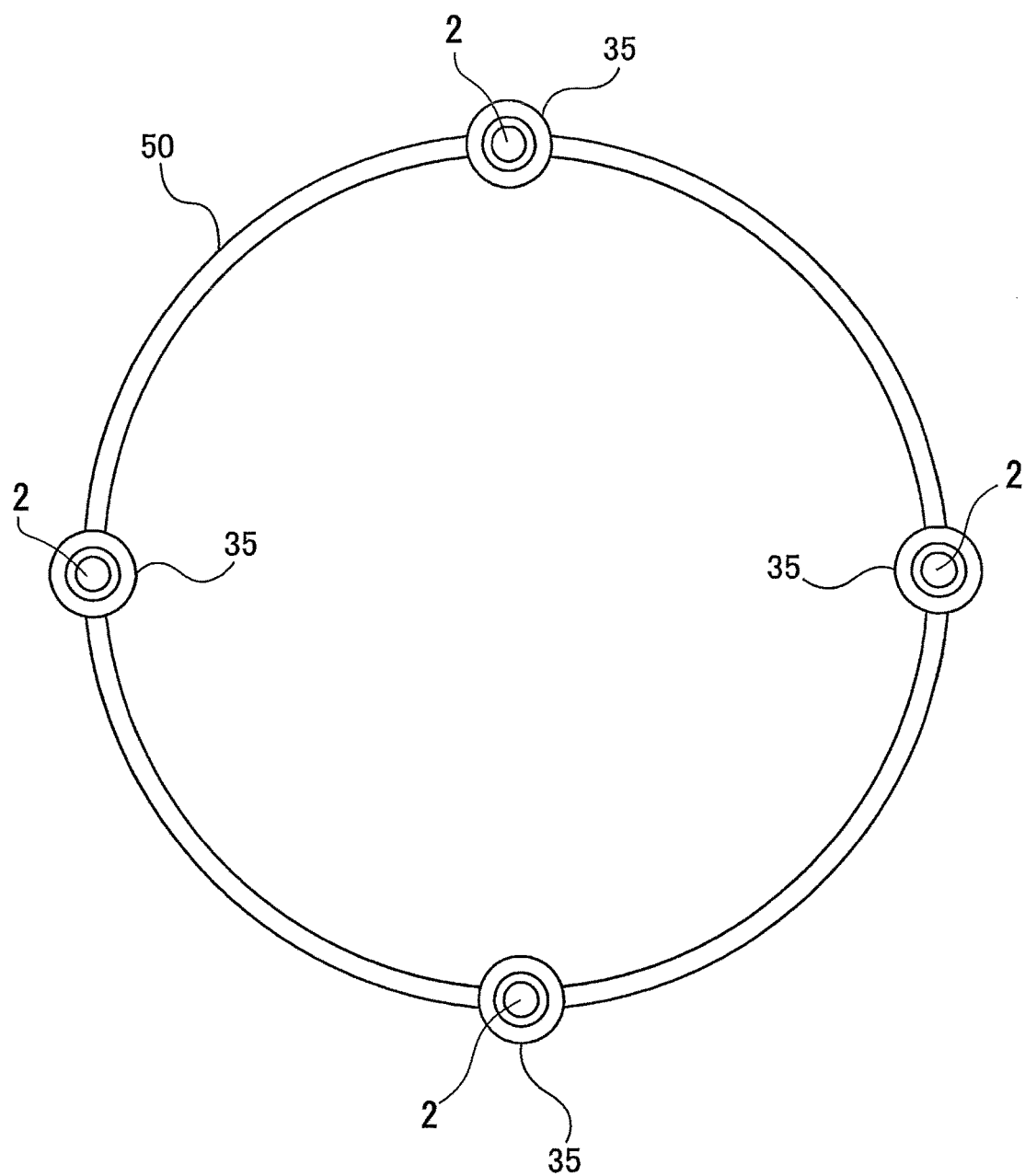
FIG. 12 is a plan view showing the coupling ring coupling the lower ends of the four support posts together.

When the wafer W is rotating at a high speed, a strong centrifugal force acts also on each support post 2, possibly causing an outward displacement of the end of the support post 2. As a result, a force with which the chuck 3 holds the wafer W can become unstable. In order to prevent such an outward displacement of the end of the support post 2, a coupling ring 50, which couples the lower ends of the four support posts 2 to each other, is provided as shown in FIGS. 11 and 12. This coupling ring 50 is secured to the spring stoppers 35 mounted to the lower ends of the support posts 2. Thus, the coupling ring 50 is coupled to the support posts 2 through the spring stoppers 35. The coupling ring 50 moves vertically together with the support posts 2, and is rotated together with the support posts 2 which are rotated around the axis of the wafer W by the motor 15. The coupling ring 50 restricts a relative position of the four support posts 2, and can therefore prevent the outward displacement of the ends of the support posts 2 even when strong centrifugal forces act on the support posts 2. Since each support post 2 is supported at its upper and lower portions by the arm 1a and the coupling ring 50, the deformation of the support posts 2 can be prevented when the wafer W is rotating at a high speed.

Figure 13:
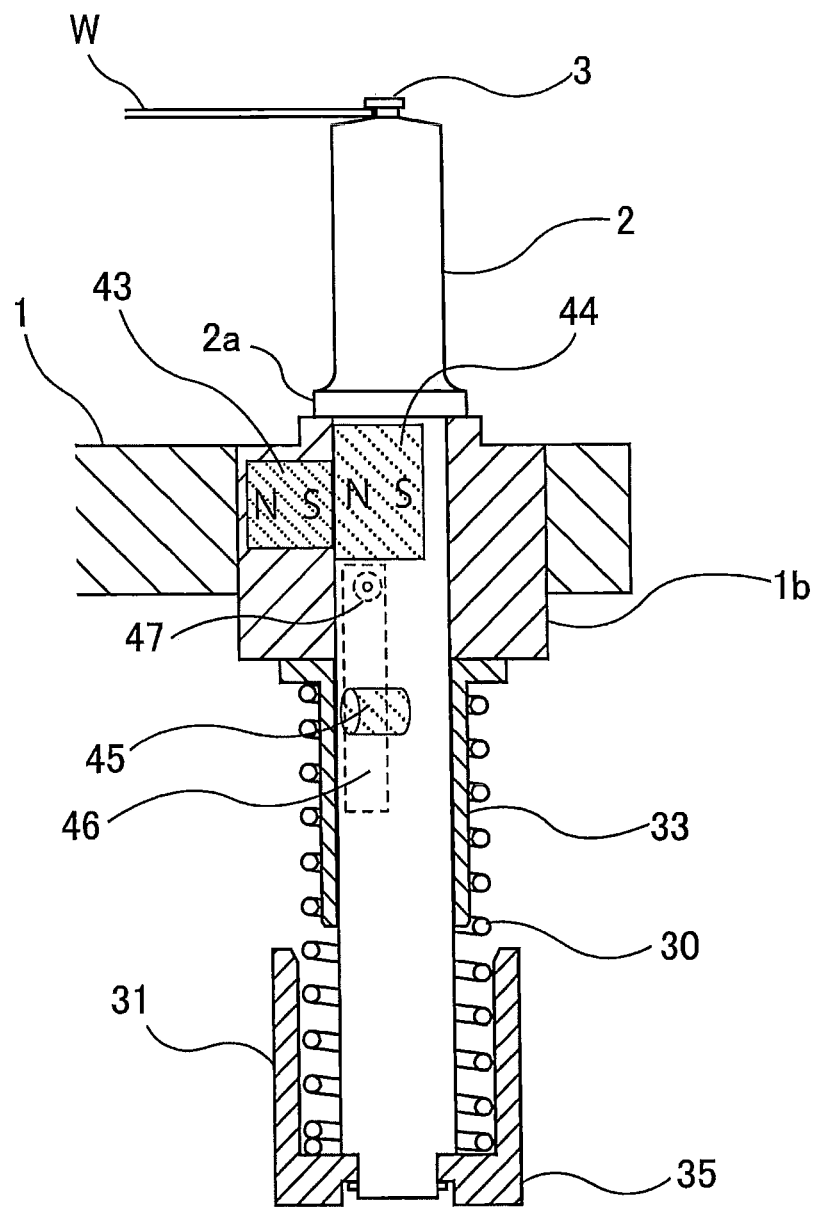
FIG. 13 is a diagram showing another embodiment.

FIG. 13 is a diagram showing another embodiment. With reference to those constructions and operations of this embodiment which are the same as those of the above-described embodiments, a duplicate description thereof is omitted. In this embodiment the inner collar 33 is disposed inside the upper portion of the spring 30, and the outer cover 31 is disposed so as to surround the lower portion of the spring 30. Therefore, the inner collar 33 serves as a first structure that restricts a movement of the upper portion of the spring 30 in a direction perpendicular to the axial direction of the support post 2, and the outer cover 31 serves as a second structure that restricts a movement of the lower portion of the spring 30 in a direction perpendicular to the axial direction of the support post 2. The spring stopper 35 is formed integrally with the outer cover 31.

When a wafer W is rotating, the upper portion of the spring 30 is supported from inside by the inner collar 33, and the lower portion of the spring 30 is supported from outside by the outer cover 31. Accordingly, even when a strong centrifugal force acts on the spring 30, the outward deformation of the spring 30 can be minimized. Also in this embodiment, the coupling ring 50 shown in FIGS. 11 and 12 may be mounted to the spring stoppers 35.

Figure 14:
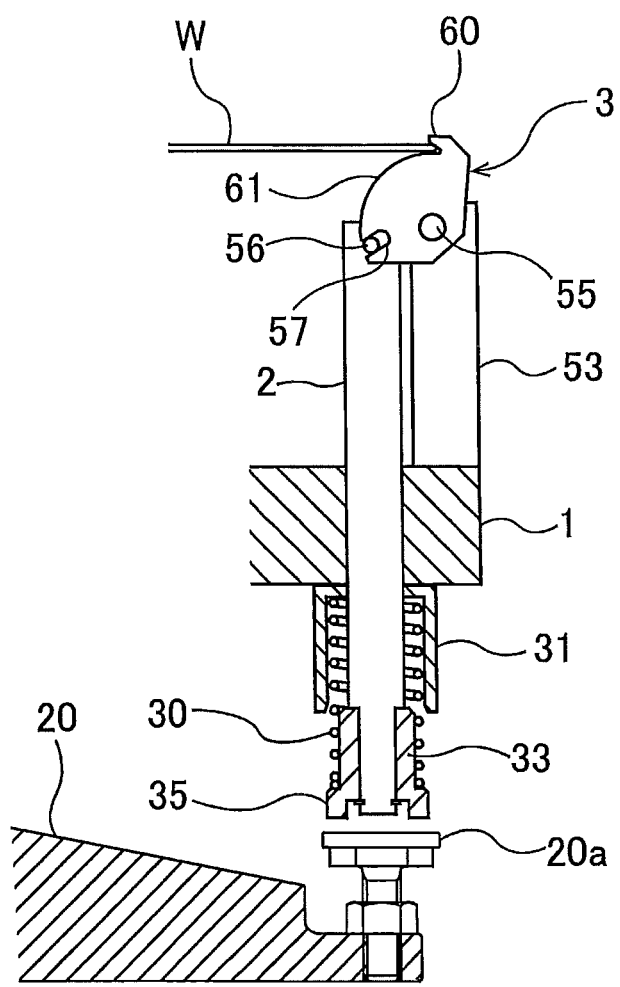
FIG. 14 is a diagram showing an embodiment of a substrate holding apparatus which uses linkages.

In the above-described embodiments shown in FIGS. 1 through 13, the force to hold a wafer W is generated by the permanent magnets. Instead of the permanent magnets, a linkage may be used to generate a force to hold a wafer W. FIG. 14 is a diagram showing an embodiment of a substrate holding apparatus which uses linkages. With reference to those constructions and operations of this embodiment which are the same as those of the above-described embodiments, a duplicate description thereof is omitted.

As shown in FIG. 14, a block 53 is secured to the base 1, and a shaft 55 extending along a tangential direction of a wafer W is attached to a distal end of the block 53. A chuck 3 is rotatably supported by the shaft 55. A pin 56 is secured to an upper portion of a support post 2. The pin 56 is in engagement with a cutout 57, which is formed in the chuck 3, such that the pin 56 can move in the cutout 57. The chuck 3 has a claw 60 for holding the periphery of the wafer W, and an arc-shaped surface 61 on which the periphery of the wafer W is temporarily placed. The arc-shaped surface 61 is curved upwardly.

Figure 15:
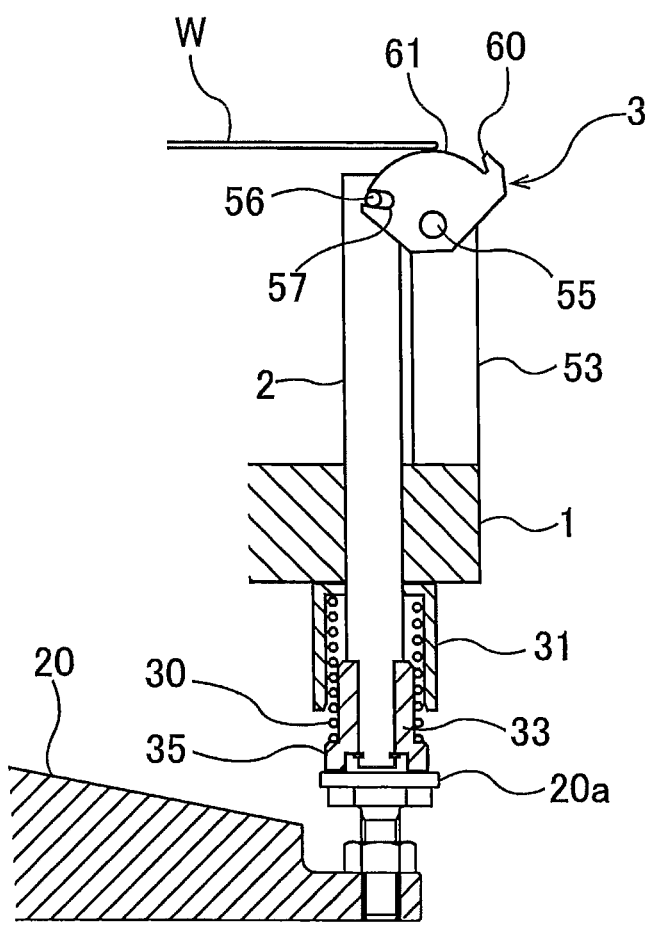
FIG. 15 is a diagram showing the substrate holding apparatus with its support posts in an elevated position.

FIG. 15 shows the support post 2 at an elevated position. As shown in FIG. 15, when the support post 2 is elevated, the pin 56 rotates the chuck 3, thereby moving the claw 60 of the chuck 3 outwardly. In this state, a wafer W is placed onto the arc-shaped surface 61 of the chuck 3. Subsequently, the support post 2 is lowered, while the pin 56 rotates the chuck 3 in the opposite direction, thereby causing the claw 60 of the chuck 3 to hold the periphery of the wafer W. Also in this embodiment, the outward deformation of the springs 30 can be minimized even when strong centrifugal forces act on the springs 30.

The centrifugal force acting on the spring 30 increases not only with an increase in a rotational speed of a wafer W, but also with a distance from a center of rotation to the spring 30. Since the substrate holding apparatus according to the above-described embodiments can restrict the outward movement of the springs 30 even when large centrifugal forces acts on the springs 30, the substrate holding apparatus can be effectively used to hold a large-diameter wafer, such as a 450 mm wafer. Further, the substrate holding apparatus according the above-described embodiments can be used to hold, besides a wafer, various other types of substrates, such as a flat panel display glass substrate.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate rotating apparatus comprising:
   a rotational shaft;
   a base secured to the rotational shaft;
   a support post movable in an axial direction relative to the base;
   a chuck provided on the support post and configured to hold a periphery of a substrate;
   a spring biasing the support post in the axial direction, the spring being additionally compressed when the substrate is to be unloaded;
   a motor coupled to the rotational shaft and configured to rotate at least the support post, the chuck, and the spring;
   a first structure fixed to a bottom surface of the base and extending downwardly from the bottom surface of the base to restrict a movement of an upper portion of the spring in a direction perpendicular to the axial direction of the support post, the first structure having an inner cylindrical surface that surrounds at least an upper half of the spring when the spring is rotated by the motor; and
   a second structure configured to restrict a movement of a lower portion of the spring in a direction perpendicular to the axial direction of the support post, the second structure being disposed inside the spring and having an outer surface that supports the lower portion of the spring, at least an upper half of the second structure being housed in the first structure when the spring is additionally compressed.

2. The substrate rotating apparatus according to claim 1, wherein the support post is rotatable relative to the second structure.

3. The substrate rotating apparatus according to claim 1, further comprising:
   a moving mechanism configured to move the support post in the axial direction against a force of the spring; and
   a rotating mechanism configured to rotate the support post about its axis in conjunction with a movement of the support post in the axial direction.

4. The substrate rotating apparatus according to claim 1, wherein:
   the support post is one of a plurality of support posts, the chuck is one of a plurality of chucks, the spring is one of a plurality of springs, the first structure is one of a plurality of first structures, and the second structure is one of a plurality of second structures; and
   the substrate rotating apparatus further comprises a coupling ring which couples the plurality of support posts to each other.

5. The substrate rotating apparatus according to claim 4, wherein the plurality of support posts and the plurality of chucks are arranged along the periphery of the substrate.

6. The substrate rotating apparatus according to claim 5, wherein the plurality of support posts and the plurality of chucks are arranged at equal intervals.

7. The substrate rotating apparatus according to claim 4, wherein the plurality of chucks are arranged at intervals that enable the plurality of chucks to hold a substrate having a diameter of 450 mm.

8. The substrate rotating apparatus according to claim 1, further comprising:
   a moving mechanism configured to move the support post in the axial direction against a force of the spring,
   wherein the compressed spring is located in a cylindrical space formed between the inner surface of the first structure and the outer surface of the second structure.

9. The substrate rotating apparatus according to claim 1, further comprising:
   a rotary cup that can surround the substrate; and
   a moving mechanism configured to move the support post in the axial direction against a force of the spring, the moving mechanism being configured to move the support post between a lower position where the substrate is to be processed within the rotary cup and a substrate transfer position higher than the rotary cup.

10. The substrate rotating apparatus according to claim 1, wherein an axial length of the inner surface the first structure is longer than an axial length of the outer surface of the second structure, and a lower end of the first structure is located higher than an upper end of the second structure.

11. The substrate rotating apparatus according to claim 1, wherein an axial length of the inner cylindrical surface of the first structure is larger than a diameter of the inner cylindrical surface of the first structure.

12. A substrate rotating apparatus comprising:
    a rotational shaft;
    a base secured to the rotational shaft;
    a support post movable in an axial direction relative to the base;
    a chuck provided on the support post and configured to hold a periphery of a substrate;
    a spring biasing the support post in the axial direction, the spring being additionally compressed when the substrate is to be unloaded;
    a motor coupled to the rotational shaft and configured to rotate at least the support post, the chuck, and the spring;
    a first structure fixed to a bottom surface of the base and extending downwardly from the bottom surface of the base to restrict a movement of an upper portion of the spring in a direction perpendicular to the axial direction of the support post, the first structure being disposed inside the spring and having an outer circumferential surface that supports at least an upper half of spring from inside when the spring is rotated by the motor; and
    a second structure configured to restrict a movement of a lower portion of the spring in a direction perpendicular to the axial direction of the support post, the second structure having an inner cylindrical surface that supports the lower portion of the spring from outside when the spring is rotated by the motor, an axial length of the inner cylindrical surface of the second structure being larger than a diameter of the inner cylindrical surface of the second structure, a part of the first structure being housed in the second structure when the spring is additionally compressed.

13. The substrate rotating apparatus according to claim 12, wherein the support post is rotatable relative to the second structure.

14. The substrate rotating apparatus according to claim 12, further comprising:
    a moving mechanism configured to move the support post in the axial direction against a force of the spring; and
    a rotating mechanism configured to rotate the support post about its axis in conjunction with a movement of the support post in the axial direction.

15. The substrate rotating apparatus according to claim 12, wherein:
the support post is one of a plurality of support posts, the chuck is one of a plurality of chucks, the spring is one of a plurality of springs, the first structure is one of a plurality of first structures, and the second structure is one of a plurality of second structures; and
the substrate rotating apparatus further comprises a coupling ring which couples the plurality of support posts to each other.

16. The substrate rotating apparatus according to claim 15, wherein the plurality of support posts and the plurality of chucks are arranged along the periphery of the substrate.

17. The substrate rotating apparatus according to claim 16, wherein the plurality of support posts and the plurality of chucks are arranged at equal intervals.

18. The substrate rotating apparatus according to claim 15, wherein the plurality of chucks are arranged at intervals that enable the plurality of chucks to hold a substrate having a diameter of 450 mm.

19. The substrate rotating apparatus according to claim 12, further comprising:
a moving mechanism configured to move the support post in the axial direction against a force of the spring,
wherein the compressed spring is located in a cylindrical space formed between the inner surface of the second structure and the outer surface of the first structure.

20. The substrate rotating apparatus according to claim 12, further comprising:
a rotary cup that can surround the substrate; and
a moving mechanism configured to move the support post in the axial direction against a force of the spring, the moving mechanism being configured to move the support post between a lower position where the substrate is to be processed within the rotary cup and a substrate transfer position higher than the rotary cup.

21. The substrate rotating apparatus according to claim 12, wherein the outer surface the first structure supports an upper half of the spring, the inner surface of the second structure surrounds a lower half of the spring, and a lower end of the first structure is located higher than an upper end of the second structure.

22. A substrate rotating apparatus comprising:
a rotational shaft;
a base secured to the rotational shaft;
a support post movable in an axial direction relative to the base;
a chuck provided on the support post and configured to hold a periphery of a substrate;
a spring biasing the support post in the axial direction, the spring being additionally compressed when the substrate is to be unloaded;
a motor coupled to the rotational shaft and configured to rotate at least the support post, the chuck, and the spring;
a rotary cup that can surround the substrate;
a moving mechanism configured to move the support post in the axial direction against a force of the spring, the moving mechanism being configured to move the support post between a lower position where the substrate is to be processed within the rotary cup and a substrate transfer position higher than the rotary cup;
a first structure fixed to a bottom surface of the base and extending downwardly from the bottom surface of the base to restrict a movement of an upper portion of the spring in a direction perpendicular to the axial direction of the support post, the first structure having an inner cylindrical surface that surrounds at least an upper half of the spring when the spring is rotated by the motor; and
a second structure configured to restrict a movement of a lower portion of the spring in a direction perpendicular to the axial direction of the support post, the second structure being disposed inside the spring and having an outer surface that supports the lower portion of the spring,
wherein at least upper half of the second structure is located in the first structure when the spring is additionally compressed, and the additionally compressed spring is located in a cylindrical space formed between the inner surface of the first structure and the outer surface of the second structure.

23. The substrate rotating apparatus according to claim 22, wherein an axial length of the inner cylindrical surface of the first structure is larger than a diameter of the inner cylindrical surface of the first structure.

24. A substrate rotating apparatus comprising:
a rotational shaft;
a base secured to the rotational shaft;
a support post movable in an axial direction relative to the base;
a chuck provided on the support post and configured to hold a periphery of a substrate;
a spring biasing the support post in the axial direction, the spring being additionally compressed when the substrate is to be unloaded;
a motor coupled to the rotational shaft and configured to rotate at least the support post, the chuck, and the spring;
a rotary cup that can surround the substrate;
a moving mechanism configured to move the support post in the axial direction against a force of the spring, the moving mechanism being configured to move the support post between a lower position where the substrate is to be processed within the rotary cup and a substrate transfer position higher than the rotary cup;
a first structure fixed to a bottom surface of the base and extending downwardly from the bottom surface of the base to restrict a movement of an upper portion of the spring in a direction perpendicular to the axial direction of the support post, the first structure being disposed inside the spring and having an outer surface that supports at least an upper half of the spring from inside when the spring is rotated by the motor; and
a second structure configured to restrict a movement of a lower portion of the spring in a direction perpendicular to the axial direction of the support post, the second structure having an inner cylindrical surface that supports the lower portion of the spring from outside when the spring is rotated by the motor, an axial length of the second structure being larger than a diameter of the inner cylindrical surface of the second structure,
wherein a part of the first structure is located in the second structure when the spring is additionally compressed, and the additionally compressed spring is located in a cylindrical space formed between the inner surface of the second structure and the outer surface of the first structure.

* * * * *